United States Patent [19]

Roark et al.

[11] Patent Number: 4,859,530
[45] Date of Patent: Aug. 22, 1989

[54] HIGH TEMPERATURE ADHESIVE FOR POLYMIDE FILMS

[75] Inventors: David N. Roark, Baton Rouge; Jules A. Lambert, Denham Springs, both of La.

[73] Assignee: Ethyl Corporation, Richmond, Va.

[21] Appl. No.: 71,368

[22] Filed: Jul. 9, 1987

[51] Int. Cl.$^4$ .......................... B32B 27/00; B32B 27/06
[52] U.S. Cl. ...................... 428/294; 428/458; 428/473.5; 156/307.3; 156/307.7; 156/311; 156/330.9
[58] Field of Search ...................... 428/458, 473.5, 294; 156/307.3, 307.7, 311, 330.9

[56] References Cited

U.S. PATENT DOCUMENTS

| | | | |
|---|---|---|---|
| 3,511,807 | 5/1970 | Lovejoy | 260/47 |
| 3,654,227 | 4/1972 | Dine-Hart | 260/37 N |
| 4,111,906 | 9/1978 | Jones | 528/229 |
| 4,124,651 | 11/1978 | Lohmann | 260/857 |
| 4,426,463 | 1/1984 | Gagliani et al. | 521/180 |
| 4,442,283 | 4/1984 | Gagliani et al. | 528/323 |
| 4,444,823 | 4/1984 | Gagliani et al. | 428/113 |
| 4,543,295 | 9/1985 | St. Clair et al. | 428/458 |
| 4,690,999 | 9/1987 | Numata | 528/188 |
| 4,725,642 | 2/1988 | Gannett et al. | 428/473.5 |
| 4,755,424 | 7/1988 | Takeoka et al. | 428/473.5 |

FOREIGN PATENT DOCUMENTS 1373906 11/1974 United Kingdom ............... 156/238

OTHER PUBLICATIONS

Adhesives Age, Jan. 1979, pp. 35-39.
R. T. Alvarez "600° F. Thermoplastic Polyimide Adhesive", a paper presented at the 29th National SAMPE Symposium, Apr. 3-5, 1987.

Primary Examiner—George F. Lesmes
Assistant Examiner—A. Harbin
Attorney, Agent, or Firm—John F. Sieberth

[57] ABSTRACT

Thermoplastic polyimides of benzophenone tetracarboxylic acid or an ester or anhydride thereof and a 2,2-bis[4-(amino-phenoxy)phenyl]hexafluoropropane are excellent adhesives for bonding polyimide films to various substrates including polyimide film, metals, etc. The film and substrate need not be abraded before application of the polyamic acid resin or polyimide precursor from which the polyimide is formed on curing. The bond is tenacious. Even after heating to 800° F. the bond was stronger than two different polyimide films. Interposing between the polyimide film and the substrate a strip or patch of a prepreg made from polyimide precursor solutions composed of monomers, solvent and polyamide acid, and applying heat to cure the resin in situ while keeping the components in intimate contact by application of slight pressure is a preferred way of applying and utilizing the adhesives. Such prepregs are also useful for bonding metal to metal or to various other substrates.

24 Claims, No Drawings

HIGH TEMPERATURE ADHESIVE FOR POLYIMIDE FILMS

BACKGROUND

Polyimide films are frequently used in a variety of high temperature applications (up to 800° F.). However, adhesives for use with such films at high temperatures are virtually unknown.

In a paper entitled "600° F. Thermoplastic Polyimide Adhesive" presented at the 29th National SAMPE Symposium, Apr. 3-5 1984. R. T. Alvarez describes the use as adhesives for aluminum, titanium and polyimide glass composites of polyimides from a reaction between a carboxy-terminated bisimide monomer and an aromatic diamine. The polyimides, termed by the author as exchange polyimides, are synthesized by first reacting a dianhydride such as 3,3',4,4'-benzophenone tetracarboxylic acid dianhydride (BTDA) with an oxoimine. The carboxy-terminated bisimide monomer is further reacted with aromatic diamines in a solvent and polymerized to an imide by an exchange reaction. The author's FIG. 3 describes some of the chemical reactions which occur during this exchange reaction. According to Alvarez, the exchange polyimides do not generate volatile by-products normally associated with linear aromatic condensation polyimides, and thus large void-free bond areas can be achieved using low pressure and low cure temperatures. An exchange polyimide from 2,2-bis[(4-aminophenoxy)phenyl]hexafluoropropane and BTDA was indicated to give the highest oxidation resistance at temperatures up to 700° F.

THE INVENTION

It has now been discovered that polyimide films adapted for high temperature service can be bonded either to themselves or to other suitable substrates by means of certain non-exchange type polyimides and subjected to temperatures as high as 800° F. without destruction of the adhesive bond. Despite the fact that the polyimide adhesive of this invention releases volatile by-products during curing, the adhesive bond between the polyimide film and its substrate is so tenacious that the polyimide film itself will tear whereas the bonded area remains intact. In short, the bond is stronger than the polyimide film itself. Moreover, neither the polyimide film nor its substrate need be abraded before application of the adhesive. It is sufficient that the film and substrate be free of excessive dirt, grit, or other loose material at the surfaces to be bonded together.

In accordance with this invention the polyimide adhesive employed is a thermoplastic polyimide polymer of benzophenone tetracarboxylic acid (or an ester or anhydride thereof) and a 2,2-bis[4-(aminophenoxy)-phenyl]hexafluoropropane, most especially 2,2-bis[4-(4-aminophenoxy)phenyl]hexafluoropropane.

These adhesives may be used with films made from any polyimide, such as those referred to in Kirk-Othmer, *Encyclopedia of Chemical Technology.* 3rd Edition, Volume 18, pages 704-719, the disclosure of which is incorporated herein. For high temperature applications the polyimide film will usually be made from one of the several commercially-available high temperature polyimide resins such as KAPTON polymer of DuPont, APICAL polymer of Kanegafuchi Chemical (available in the U. S. from Allied-Signal); and UPI-LEX polymer of Ube Industries (available in the U. S. from ICI America).

In one embodiment of this invention polyimide film is bonded to polyimide film, usually at one or more overlapping seams to produce a larger film sheet. If desired however laminates of polyimide film may be formed by superimposing one or more sheets of polyimide upon a base polyimide sheet and utilizing the above adhesive to bond these sheets together, at least at or near their edge portions. The individual polyimide films used in this embodiment may differ from each other, but preferably are composed of the same polyimide polymer.

In another embodiment, the polyimide film is bonded to a metallic substrate such as a sheet of aluminum, titanium, copper, or the like. Other suitable substrates include foamed or expanded metal, plastic foams (preferably polyimide foams), honeycomb structures and ceramics.

In all cases, the adhesive is preferably applied in the form of the polyamic acid-amide and heated to a high enough temperature to cause curing (i.e., formation of the polyimide in situ). The polyimide film and the substrate to which it is to be bonded, most preferably another sheet of polyimide film, are preferably maintained under sufficient pressure to insure intimate contact between their respective surfaces and the adhesive therebetween during the heating operation effecting the cure.

In a preferred embodiment of this invention the above polyimide adhesives are employed initially in the form of a sheet, patch, or strip of a polyimide precursor prepreg (sometimes referred to as prepreg tape) which is interposed between the polyimide film and the substrate to which it is to be bonded (for example, another sheet of polyimide film) and heated to effect curing of the precursor so that the polyimide adhesive is formed in situ. Among the advantages of using the prepreg as the medium for effecting the adhesion are the following:

(1) The prepreg can be cut to match the required or desired bond area.
(2) The tackiness of the prepreg temporarily holds the parts together prior to application of the heat to effect curing and permanent bonding.
(3) The resin does not migrate appreciably from the fibers in the prepreg during cure.
(4) Uniformity of the adhesive bond along seams is improved and easily achieved.
(5) The fibers of the prepreg define the bond line and spacing between the objects being bonded together, and this affords better adhesion performance.

Preferred prepregs for use in this embodiment of the invention are composed of a fibrous substrate (e.g., unidirectionally aligned fibers or a woven cloth) impregnated with a tacky polyimide precursor of (a) a substantially equimolar mixture of (i) 2,2-bis[4-(4-aminophenoxy)phenyl]hexafluoropropane or 2,2-bis[4-(3,-aminophenoxy)phenyl]hexafluorbpropane, or both, and (ii) lower alkyl diester of ben-ophenone tetracarboxylic acid; (b) about 2 to 50 weight percent of polyamide (polyamic acid) producible from components (i) and (ii); and (c) about 10 to 50 weight percent of solvent. Such tacky polyimide precursors are resinous solids at 25° C., have softening temperatures in the range of about 30° to 40° C. and are viscous liquids at 60° C.

The polyamide —component (b) —will generally be of relatively low molecular weight, e.g., its weight average molecular weight will often fall in the range of about 1500 to 5000. It may be prepared from components (i) and (ii) or it may be prepared by reacting benzophenone tetracarboxylic acid or its dianhydride with component (i).

For best results, the solvent —component (c)— of these compositions should contain from 10 to 100 percent by weight of one or more dipolar aprotic solvents, preferably dimethylformamide, dimethylacetamide, N-methylpyrrole, diglyme, dimethylsulfoxide, or the like. Other solvents which may be used include ethers such as tetrahydrofuran, tetrahydropyran, etc.; chlorohydrocarbons such as methylene dichloride, etc.; ketones such as acetone, methyl ethyl ketone, etc.; alcohols such as methanol, ethanol, propanol, isopropanol, etc.; and the like.

To produce such polyimide precursors mixtures used in forming the prepregs various procedures may be used. One useful procedure involves heating benzophenone tetracarboxylic acid dianhydride for 2 to 3 hours with a low boiling alcohol (e.g., ethyl alcohol, EtOH) in a dipolar aprotic solvent such as N-methyl pyrrolidone (NMP), dimethylformamide (DMF), or dimethylacetamide (DMAC) at 60°–90° C. until reaction is complete (1 to 3 hours). Two moles of alcohol react per mole of anhydride and a solution containing an equimolar mixture of two isomeric diesters forms. Small amounts of monoester triacid and sometimes small amounts of monoester monoanhydride are present as by-products. An equimolar quantity of 2,2-bis[4-(4-aminophenoxy)-phenyl]hexafluoropropane (4-BDAF) and/or the corresponding 3-amino isomer (3-BDAF) is dissolved in the diester solution to give a dark clear amber liquid containing about 60% non-volatile solids (NVS). This free flowing liquid (typically 100–600 cst at 25° C.) is then heated on a rotary evaporator under vacuum at 70° to 95° C. for about 2 hours to remove solvent and increase the NVS to about 80 weight percent. The product is a very viscous liquid at 60° to 80° C. that sets to a dark clear resinous solid at room temperature. In addition to monomers (diester +4-BDAF and/or 3-BDAF) it contains small quantities of low molecular weight polyamic esters and acids.

For further details concerning the production of such precursors and prepregs therefrom, reference may be had to copending application Ser. No. 37,537, filed Apr. 13, 1987, of W. E. Wright assigned to the assignee of this application.

In another embodiment of this invention prepregs formed from a fibrous substrate (e.g., carbon fibers, glass scrim, etc.) impregnated with a tacky polyimide precursor mixture as above described are used as an adhesive for bonding metal surfaces to each other. Any of a wide variety of metals and metal alloys can be bonded together by use of such prepregs. For example this embodiment of the invention makes it possible to bond steel to steel, aluminum to aluminum, titanium to titanium, steel to aluminum, steel to titanium, aluminum to titanium, magnesium to magnesium, magnesium to aluminum, nickel to steel, aluminum-silicon alloy to aluminum, molybdenum to steel, and in general any structural metal to itself or to another structural metal.

The only requirements are that the surfaces of the metal to be bonded together have sufficient surface areas to allow the interpositioning therebetween of a piece or strip or sheet of the prepreg and that such surface areas be reasonably clean (i.e., free of excessive grit, dirt, grease or the like). To effect the bonding of the resulting metal-prepreg-metal composites heat is applied to effect curing to polyimide adhesive in situ while the parts are under sufficient pressure to hold them in place. The result is a metal-fiber reinforced polyimide-metal composite, which of course may have any number of plies.

Such composites can be subjected to temperatures of 800° F. or higher without deterioration of the adhesive bond.

Other materials that can be bonded either to like substrates or to different types of substrates by means of the prepreg tape include glass, ceramics, intermetallic compounds, masonry, and the like.

The following Examples further illustrate this invention.

Examples 1–4 illustrate the synthesis of various uncured adhesives useful in the practice of this invention. The synthesis of such materials is also described and is claimed in copending application Serial No. 37,537 file Apr. 13, 1987, by W. E. Wright and assigned to the assignee of the present application. In Examples 1–4 all percentages are by weight unless otherwise specified.

EXAMPLE 1

Using apparatus composed of a glass reaction flask fitted with mechanical stirrer, reflux condenser, dropping funnel, thermometer and nitrogen inlet, 336 grams of methanol was added to a stirred slurry of 1611 grams of 3,3′,4,4′-benzophenone tetracarboxylic acid dianhydride and 1425 grams of N-methyl pyrrolidone (NMP) over a 50-minute period. The temperature rose to about 80° C. and after cooling it was kept at 70° C. for three hours. NMR analysis showed the viscous liquid product was composed of 57% dimethyl ester of benzophenone tetracarboxylic acid and 43% NMP.

In a sealed stainless steel reactor, 2660 grams of this liquid product was reacted with 4080 grams of a 50% solution of 2,2-bis[4-(4-aminophenoxy)phenyl]hexafluoropropane in tetrahydrofuran (THF) under pressure at 60°–80° C. for about four hours. After overnight cooling, THF was removed by distillation at 50°–60° C. under reduced pressure (down to 10 mm Hg). The recovered resinous polyimide precursor contained about 76% solids and about 24% NMP.

EXAMPLE 2

The general procedure used in these examples was as follows: Benzophenonetetracarboxylic dianhydride (BTDA) was heated with a low boiling alcohol, i. e., ethyl alcohol (EtOH), or isopropyl alcohol (IPA), or methyl alcohol (MeOH), in a dipolar aprotic solvent, namely NMP at 60°–90° C. until reaction was complete. Two moles of alcohol react per mole of anhydride and a solution containing an equimolar mixture of two isomeric diesters forms. An equimolar quantity of 2,2-bis[4-(4-aminophenoxy)phenyl]hexafluoropropane (4-BDAF) was dissolved in the diester solution to give a dark clear amber liquid containing about 60% non-volatile solids (NVS). This free flowing liquid (typically 100–600 cst at 25° C.) was then heated on a rotary evaporator under vacuum at 70 to 95° C. for about two hours to remove solvent and increase the NVS to about 80 weight percent. The products are very viscous liquids at 60 to 80° C. that set to a dark clear resinous solid at room temperature.

Experimental conditions and results are summarized in the ensuing Table.

| Example No. | 2 | 3 | 4 |
| --- | --- | --- | --- |
| A. DIESTER PREPARATION | | | |
| Anhydride | | | |
| Type | BTDA | BTDA | BTDA |
| g | 322 | 322 | 322 |
| Mole | 1.0 | 1.0 | 1.0 |
| Alcohol | | | |
| Type | EtOH | IPA | MeOH |
| g | 101 | 132 | 70 |
| Mole | 2.2 | 2.2 | 2.2 |
| Solvent | | 600 g | 600 g |
| Wt. & Type | 600 g NMP | NMP | NMP |
| Conditions | | | |
| Temp °C. | 60-75 | 70-84 | 60-75 |
| Time Hr | 5 | 4.5 | 2 |
| B. DIESTER 4-BDAF | | | |
| Mole Diester | 0.99 | 0.99 | 0.99 |
| Mole 4-BDAF | 0.99 | 0.99 | 0.99 |
| Solvent | 227 | 0 | 0 |
| Solids wt % | 50 | 66 | 60 |
| C. STRIP | | | |
| Temp °C. | 80-95 | 80-95 | 80-95 |
| Time Hr | 2.8 | 2 | 2 |
| Pressure mm Hg | 1-5 | 1-5 | 2-5 |
| Water Mole | 0.58 | 0.66 | 0.76 |
| Alcohol Mole | 0.00 | 0.05 | 0.13 |
| Amidization Route | | | |
| Via COOH % | 30 | 28 | 36 |
| Via COOR % | 0 | 3 | 7 |
| % Solids wt % | 73 | 84 | 77 |

Example 5 illustrates a useful procedure for producing a polyamic acid of 4-BDAF and BTDA that has been found useful as an adhesive in accordance with this invention.

EXAMPLE 5

24.67 g 4-BDAF dissolved in 64.00 g of dry N-methyl-pyrrolidome (NMP) in a nitrogen purged dry box was transferred to a 150 ml flask. 10.00 g of NMP was used to rinse the 4-BDAF from its container into the flask. A BTDA solution was prepared in a dry box by dissolving 25.00 g of BTDA in 75.00 g of dry NMP at approximately 80° C. This solution was transferred to a dry 60 ml syringe preheated to 60° C. The syringe needle was stoppered, the syringe weighed and transferred to a 60° C. oven. After the flask containing the 4-BDAF solution was heated to 81° C., 61.38 g of the BTDA solution was added to the flask in increments over a 39 minute period, maintaining the flask temperature between 74 and 81° C., in a nitrogen atmosphere and keeping th BTDA solution syringe at 60° C. by keeping it in a 60° C. oven. After all BTDA was added, the temperature of the flask was maintained in the 81 to 89° C. range for 2.0 hours before heating was stopped and the flask and contents were transferred to a dry box, where contents of the flask were removed for analysis. The weight average molecular weight on the polyamic acid was 95,000 daltons and the number average molecular weight was 16,000 daltons. Inherent viscosity was 1.15 dl/g.

Examples 6-7 illustrate the use of the adhesives pursuant to this invention to bond pre-abraded films together.

EXAMPLE 6

Two sheets of UPILEX ® film (a polyimide of biphenyl tetracarboxylic acid dianhydride and oxydianiline of Ube Industries available in the U. S. A. from ICI America) were spliced together by roughening their edges in the overlapping seam area by means of 600 grit emery paper. An adhesive resin similar to that of Example 5 was applied between the overlapping film surfaces and light pressure applied to spread the resin. The resulting composite was placed in an oven at 200° C. for 30 minutes to drive off the NMP solvent. Then with a pressure of below about 25 psig applied to the seam, the adhesive was cured at 300° C. for 30 minutes. The seam exhibited good adhesive qualities after being subjected to various temperatures ranging from 750° F. for 30 minutes to 900° F. for 10 minutes. The heating at 900° F. was terminated after 10 minutes because of failure of the film itself —it began to curl, crack and become brittle.

EXAMPLE 7

The same procedure as in Example 6 was applied to Kapton ®film (a polyimide of pyromellitic dianhydride and oxydianiline available from DuPont). It also survived 10 minutes at 900° F.

Similar results as in Examples 6 and 7 may be achieved by use of benzophenone tetracarboxylic acid/2,2-bis[4-(3-aminophenoxy)phenyl]hexafluoropropane polyimide as the in situ formed adhesive.

Examples 8 and 9 illustrate the discovery that it is not necessary to abrade the film before applying the adhesive.

EXAMPLE 8

The surfaces of two sheets of Kapton film were wiped with a cloth wet with acetone but were not abraded. A resinous polyimide precursor prepared generally as in Example 5 was spread between the cleaned overlapping surfaces of the film sheets and while applying slight pressure to the seam (less than 25 psig) the films were heated to 100° C. for 10 minutes 200° C. for 30 minutes and 300° C. for 30 minutes to effect the curing of the adhesive. The bonded seams were then exposed to 425° C. (800° F.) for 10 minutes. On cooling back to room temperature, it was found that the bonded area was stronger than the Kapton film. The film tore whereas the seam remained intact.

EXAMPLE 9

Using the surface cleaning procedure, adhesive and curing temperature cycle as in Example 8, a sheet of unabraded Kapton film was bonded under slight pressure to a sheet of unabraded aluminum. The composite was then heated to 425° C. as in Example 8. Tenacious bonding occurred. Here again the film tore but the bonded seam remained intact.

Example 10 illustrates the preparation by the so-called pseudo hot-melt procedure of a prepreg used as an adhesive medium pursuant to this invention. The production of such prepregs is also described and is claimed in copending application Serial No. 37,537 filed Apr. 13, 1987, by W. E. Wright and assigned to the assignee of the present application.

EXAMPLE 10

Polyimide precursor prepared generally as in Example 4 was heated to about 100-125° C. and applied to the roll of a typical roll coater in which the roll was maintained at about this same temperature. A strip of unidirectionally aligned carbon fibers (AS-4 from Hercules) was passed under the roll whereby the fibers were coated and the strip impregnated with the precursor. The resultant impregnated strip was promptly cooled to yield a continuous strip of tacky prepreg which was taken up on a spool along with a release paper which had been treated with a release agent.

Procedures such as described in Example 10 are applicable to the formation of prepregs of unidirectionally aligned glass fibers, glass scrim, and other fibrous substrates.

Example 11 illustrates the use of prepregs of the adhesive in bonding various substrates together pursuant to a preferred embodiment of this invention.

EXAMPLE 11

Strips of prepreg produced as in Example 10 were placed between the overlapping seams of (a) two sheets of Kapton film, (b) one sheet of Kapton film and a flat coupon of aluminum, and (c) two aluminum coupons. The surfaces had been cleaned as in Example 7 but not abraded. The resultant composites were placed under slight pressure at the seams (<25 psig) and the curing cycle of Example 7 was used in order to cure the adhesive. In all cases very tenacious bonding was achieved. After heating for 10 minutes at 425° C. and cooling to room temperature the bonds in composites (a) and (b) were stronger than the film itself. In the case of composite (c), the aluminum coupons could only be torn apart with difficulty by use of pliers.

In the applications such as are illustrated in Example 11, it is preferred to employ prepregs made with glass scrim or unidirectionally aligned glass fibers or filaments.

EXAMPLE 12

Using the procedure f Example 9, unabraded Kapton film
was bonded to an unabraded plate of metallic copper, and two unabraded plates of metallic copper were bonded together. Tenacious bonding occurred in both instances.

This invention is susceptible to considerable variation in its practice, the forms given hereinabove being merely for the purpose of illustration.

What is claimed is:

1. A method of bonding a metal to a substrate which comprises placing therebetween a prepreg composed of a fibrous substrate coated and impregnated with a tacky polyimide precursor of (a) a substantially equimolar mixture of (i) 2,2-bis[4-(4-(4aminophenoxy)phenyl]hexafluoropropane or 2,2-bis[4-(3-aminophenoxy)phenyl]hexafluoropropane, or both, and (ii) lower alkyl diester of benzophenone tetracarboxylic acid; (b) about 2 to 50 weight percent of polyamic acid polyamide producible from components (i) and (ii); and (c) about 10 to 50 weight percent of solvent; applying heat to cause the formation of the polyimide in situ while maintaining the metal and first-named substrate in intimate contact with the curing prepreg; and then cooling the resultant article.

2. The method of claim 1 in which the 2,2-bis[4-(aminophenoxy)phenyl]hexafluoropropane of the precursor is 2,2-bis[4-(4-aminophenoxy)]hexafluoropropane.

3. The method claim 1 in which the first-named substrate is a polyimide film.

4. The method of claim 1 in which the first-named substrate is a metal.

5. The method of claim 1 wherein the fibrous substrate of the prepreg is composed of unidirectionally aligned fibers.

6. The method of claim 1 wherein the fibrous substrate of the prepreg is a strip or tape.

7. The method of claim 1 wherein the surfaces of the metal and the substrate between which the prepreg is placed are not pre-abraded.

8. An article produced according to claim 1 wherein the fibrous substrate of the prepreg is composed of unidirectionally aligned fibers.

9. An article produced according to claim 1 wherein the fibrous substrate of the prepreg is a strip or tape.

10. An article produced according to claim 1.

11. An article produced according to claim 1 in which the 2,2-bis[4-(aminophenoxy)phenyl]hexafluoropropane of the precursor is 2,2-bis[4-(4-(aminophenoxy)phenyl)]hexafluoropropane.

12. An article produced according to claim 1 in which the first-named substrate is a polyimide film.

13. An article produced according to claim 1 in which the first-named substrate is a metal.

14. A method of bonding a polyimide film to a substrate which comprises placing therebetween a prepreg composed of a fibrous substrate coated and impregnated with a tacky polyimide precursor of (a) a substantially equimolar mixture of (i) 2,2-bis[4-(4-aminophenoxy)-phenyl]hexafluoropropane or 2,2-bis[4(3-aminophenoxy)phenyl]hexafluoropropane, or both, and (ii) lower alkyl diester of benzophenone tetracarboxylic acid; (b) about 2 to 50 weight percent of polyamic acid polyamide producible from components (i) and (ii); and (c) about 1 to 50 weight percent of solvent; applying heat to cause the formation of the polyimide in situ while maintaining the polyimide film and first-named substrate in intimate contact with the curing prepreg; and then cooling the resultant article.

15. The method of claim 14 in which the 2,2-bix-[4(aminophenoxy)phenyl]hexafluoropropane of the precursor is 2,2-bis[4-(4-aminophenoxy)phenyl]hexafluoropropane.

16. The method of claim 14 where in the fibrous substrate of the prepreg is composed of unidirectionally aligned fibers.

17. The method of claim 14 wherein the fibrous substrate of the prepreg is a strip or tape.

18. The method of claim 14 wherein the surfaces of the metal and the substrate between which the prepreg is placed are not pre-abraded.

19. The method of claim 14 in which the first-named substrate is a polyimide film.

20. An article produced according to claim 19.

21. The method of claim 14 in which the polyimide film and the substrate are polyimide films of pyromellitic dianhydride and oxydianiline.

22. An article produced according to claim 21.

23. An article produced according to claim 14 wherein the fibrous substrate of the prepreg is composed of unidirectionally aligned fibers.

24. An article produced according to claim 14 wherein the fibrous substrate of the prepreg is a strip or tape.

* * * * *

UNITED STATES PATENT AND TRADEMARK OFFICE
CERTIFICATE OF CORRECTION

PATENT NO.   : 4,859,530
DATED        : August 22, 1989
INVENTOR(S)  : David N. Roark, et al It is certified that error appears in the above-identified patent and that said Letters Patent is hereby corrected as shown below:

Face of patent item [54] title reads "Polymide" and should read -- Polyimide --.

Column 7, line 48 reads "(4-(4aminophenoxy)" and should read -- 4-(4-aminophenoxy)--.

Column 7, lines 62-3 read "2,2-bis[4-(4-aminophenoxy)]hexafluoropropane" and should read -- 2,2-bis[4-(4-aminophenoxy)phenyl]hexafluoropropane --.

Column 8, line 19 reads "[4-(4-(aminophenoxy)" and should read -- [4-(4-aminophenoxy) --.

Column 8, line 35 reads "1 to 50" and should read -- 10 to 50 --.

Column 8, line 40 reads "2,2-bix" and should read -- 2,2-bis --.

Signed and Sealed this

Fourth Day of September, 1990

Attest:

HARRY F. MANBECK, JR.

*Attesting Officer*     *Commissioner of Patents and Trademarks*